United States Patent
Ku et al.

(10) Patent No.: US 8,859,364 B2
(45) Date of Patent: Oct. 14, 2014

(54) MANUFACTURING METHOD OF NON-VOLATILE MEMORY

(71) Applicant: MACRONIX International Co., Ltd., Hsinchu (TW)

(72) Inventors: Shaw-Hung Ku, Hsinchu (TW); Chi-Pei Lu, Hsinchu (TW); Chun-Lien Su, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/153,897

(22) Filed: Jan. 13, 2014

(65) Prior Publication Data

US 2014/0127894 A1    May 8, 2014

Related U.S. Application Data

(62) Division of application No. 13/494,720, filed on Jun. 12, 2012, now Pat. No. 8,664,710.

(51) Int. Cl.
| | | |
|---|---|---|
| H01L 21/336 | (2006.01) | |
| H01L 29/788 | (2006.01) | |
| H01L 29/51 | (2006.01) | |
| H01L 29/66 | (2006.01) | |
| H01L 21/28 | (2006.01) | |
| H01L 29/423 | (2006.01) | |

(52) U.S. Cl.
CPC ...... *H01L 21/28273* (2013.01); *H01L 29/7881* (2013.01); *H01L 29/513* (2013.01); *H01L 29/66825* (2013.01); *H01L 29/518* (2013.01); *H01L 29/42324* (2013.01)

USPC ........... 438/257; 438/287; 438/591; 257/315; 257/316; 257/324; 257/E29.129; 257/E29.309

(58) Field of Classification Search
CPC .................... H01L 21/28273; H01L 21/28282
USPC .......... 438/257, 287, 591; 257/315, 316, 324, 257/E29.129, E29.3, E29.309
See application file for complete search history.

(56) References Cited

U.S. PATENT DOCUMENTS

2009/0262583 A1 * 10/2009 Lue ........................... 365/185.28
2011/0012190 A1 *  1/2011 Tanaka et al. ................. 257/324

FOREIGN PATENT DOCUMENTS

| TW | 200701441 | 1/2007 |
| TW | 200713278 | 4/2007 |
| TW | 200905888 | 2/2009 |

OTHER PUBLICATIONS

"Office Action of Taiwan Counterpart Application", issued on Jul. 28, 2014, p. 1-6.

* cited by examiner

*Primary Examiner* — Tu-Tu Ho
(74) *Attorney, Agent, or Firm* — J.C. Patents

(57) ABSTRACT

The present invention provides a manufacturing method of a non-volatile memory including forming a gate dielectric layer on a substrate; forming a floating gate on the gate dielectric layer; forming a first charge blocking layer on the floating gate; forming a nitride layer on the first charge blocking layer; forming a second charge blocking layer on the nitride layer; forming a control gate on the second charge blocking layer; and performing a treatment to the nitride layer to get a higher dielectric constant.

19 Claims, 8 Drawing Sheets

MANUFACTURING METHOD OF NON-VOLATILE MEMORY

CROSS-REFERENCE TO RELATED APPLICATION

This application is a divisional application of U.S. application Ser. No. 13/494,720, filed on Jun. 12, 2012, now allowed. The entirety of the above-mentioned patent application is hereby incorporated by reference herein and made a part of this specification.

BACKGROUND OF THE INVENTION

1. Field of Invention

The present invention relates to a memory and a manufacturing method thereof, and more particularly, to a non-volatile memory and a manufacturing method thereof.

2. Description of Related Art

A non-volatile memory is able to retain the stored data even when the electrical power is off. As a result, many electronic products have such memories to provide normal operations when booted. In particular, a flash memory allows multiple data writing, reading, and erasing operations. With these advantages, the flash memory has become one of the most widely adopted memory devices in personal computers and electronic equipments.

Higher gate coupling ratio (GCR) and transconductance (Gm) are desired for a flash memory to enable the memory to have better performance. The gate coupling ratio and transconductance are associated with the inter-gate dielectric layer. The capacitance of the inter-gate dielectric layer can be increased as the inter-gate dielectric layer becomes thinner and the dielectric constant thereof gets higher. In addition, the gate coupling ratio can be increased as the area of the inter-gate dielectric layer becomes greater.

However, a thin inter-gate dielectric layer frequently results in the degradation of data retention. Further, a high dielectric constant (high-k) material is usually not compatible with the existing memory processes. Besides, the manufacturing process is difficult when the area of the inter-gate dielectric layer is increased. Therefore, how to effectively increase the gate coupling ratio and transconductance in the existing processes has become one of the main topics in the industry.

SUMMARY OF THE INVENTION

The present invention provides a non-volatile memory with a charged nitride layer.

The present invention further provides a method of forming a non-volatile memory, by which a non-volatile memory with a nitride layer having a higher dielectric constant is formed.

The present invention provides a non-volatile memory including a gate dielectric layer, a floating gate, a control gate, an inter-gate dielectric structure and two doped regions. The gate dielectric layer is disposed on a substrate. The floating gate is disposed on the gate dielectric layer. The control gate is disposed on the floating gate. The inter-gate dielectric structure is disposed between the control gate and the floating gate. The inter-gate dielectric structure includes a first oxide layer, a second oxide layer and a charged nitride layer. The first oxide layer is disposed on the floating gate. The second oxide layer is disposed on the first oxide layer. The charged nitride layer is disposed between the first oxide layer and the second oxide layer. The doped regions are disposed in the substrate at two sides of the floating gate, respectively.

According to an embodiment of the present invention, the charged nitride layer includes an N-type dopant therein.

According to an embodiment of the present invention, the charged nitride layer includes electrons therein.

According to an embodiment of the present invention, the thickness of the charged nitride layer can be, but is not limited to, between 15 angstroms and 100 angstroms.

According to an embodiment of the present invention, the thickness of the first oxide layer can be, but is not limited to, between 15 angstroms and 60 angstroms.

According to an embodiment of the present invention, the thickness of the second oxide layer can be, but is not limited to, between 15 angstroms and 60 angstroms.

The present invention further provides a manufacturing method of a non-volatile memory including forming a gate dielectric layer on a substrate; forming a floating gate on the gate dielectric layer; forming a first charge blocking layer on the floating gate; forming a nitride layer on the first charge blocking layer; forming a second charge blocking layer on the nitride layer; forming a control gate on the second charge blocking layer; and performing a treatment to the nitride layer to get a higher dielectric constant.

According to an embodiment of the present invention, the charging treatment includes performing an implantation to the nitride layer with an N-type dopant.

According to an embodiment of the present invention, wherein the treatment is performed after the step of forming the nitride layer and before the step of forming the second charge blocking layer.

According to an embodiment of the present invention, the treatment is performed after the step of forming the second charge blocking layer and before the step of forming the control gate.

According to an embodiment of the present invention, the treatment is performed after the step of forming the control gate and before the step of forming the doped regions.

According to an embodiment of the present invention, the treatment is performed simultaneously during the step of forming the doped regions.

According to an embodiment of the present invention, the treatment includes injecting charges into the nitride layer.

According to an embodiment of the present invention, the treatment is performed after the step of forming the doped regions, and the treatment includes applying a voltage of more than 7 MV/cm to the control gate, so as to inject the electrons into the nitride layer.

The present invention further provides a manufacturing method of a non-volatile memory including forming a gate dielectric layer on a substrate; forming a floating gate on the gate dielectric layer; forming an inter-gate dielectric structure on the floating gate, wherein the inter-gate dielectric structure comprising a nitride layer; forming a control gate on the inter-gate dielectric structure; forming two doped regions in the substrate respectively at two sides of the floating gate; and performing a trapping treatment to the inter-gate dielectric structure.

According to an embodiment of the present invention, the trapping treatment comprises performing an implantation to the nitride layer with an N-type dopant.

According to an embodiment of the present invention, the inter-gate dielectric structure comprises a first charge blocking layer formed on the floating gate, the nitride layer formed on the first charge blocking layer and a second charge blocking layer formed on the nitride layer.

According to an embodiment of the present invention, the trapping treatment is performed after the step of forming the nitride layer and before the step of forming the second charge blocking layer.

According to an embodiment of the present invention, the trapping treatment is performed after the step of forming the second charge blocking layer and before the step of forming the control gate.

According to an embodiment of the present invention, the trapping treatment is performed after the step of forming the control gate and before the step of forming the doped regions.

According to an embodiment of the present invention, the trapping treatment is performed simultaneously during the step of forming the doped regions.

According to an embodiment of the present invention, the trapping treatment comprises injecting charges into the inter-gate dielectric structure.

According to an embodiment of the present invention, the trapping treatment is performed after the step of forming the doped regions, and the charging treatment comprises applying a voltage of more than 7 MV/cm to the control gate, so as to inject the electrons into the nitride layer.

According to an embodiment of the present invention, the trapping treatment comprises injecting electrons into the inter-gate dielectric structure.

According to an embodiment of the present invention, the inter-gate dielectric getting higher dielectric constant after the trapping treatment.

According to an embodiment of the present invention, the inter-gate dielectric structure comprising a nitride material.

In view of the above, in the present invention, after the nitride layer in the inter-gate dielectric structure is formed, a charging treatment is performed thereto as so to form a charged nitride layer. Therefore, the conductivity of the nitride layer is enhanced and the gate coupling ratio and transconductance of the non-volatile memory is accordingly increased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
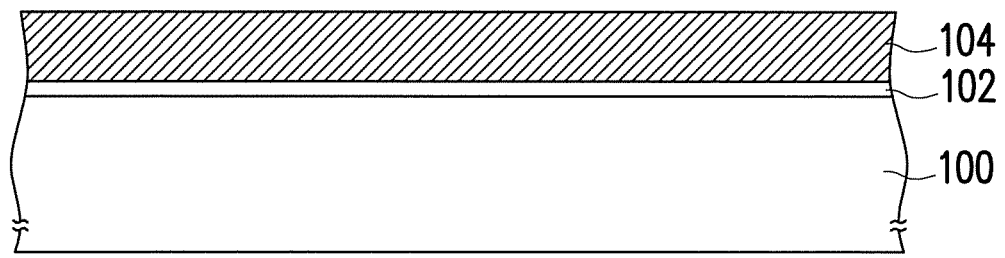
FIG. 1A to FIG. 1D are cross-sectional views illustrating a manufacturing method of a non-volatile memory according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Several embodiments are provided below to illustrate a manufacturing method of a non-volatile memory of the present invention. In the method of the present invention, the gate coupling ratio and transconductance of the non-volatile memory can be effectively increased by forming the inter-gate dielectric structure with a charged nitride layer. It is noted that the step of forming the charged nitride layer can be applied to the process for forming the later-described non-volatile memory structure, but the present invention is not limited thereto. In other words, the step of forming the charged nitride layer can be applied to the process for forming any other non-volatile memory structure, as long as such non-volatile memory structure has an oxide/nitride/oxide (ONO) inter-gate dielectric structure.

FIG. 1A to FIG. 1D are cross-sectional views illustrating a manufacturing method of a non-volatile memory according to an embodiment of the present invention. Referring to FIG. 1A, a dielectric layer 102 is formed on a substrate 100. The dielectric layer 102 includes silicon oxide, and the forming method thereof includes performing a thermal oxidation process or a chemical vapour deposition (CVD) process. Thereafter, a conductive layer 104 is formed on the dielectric layer 102. The conductive layer 104 includes polysilicon, and the forming method thereof includes performing a CVD process.

Figure 1B:
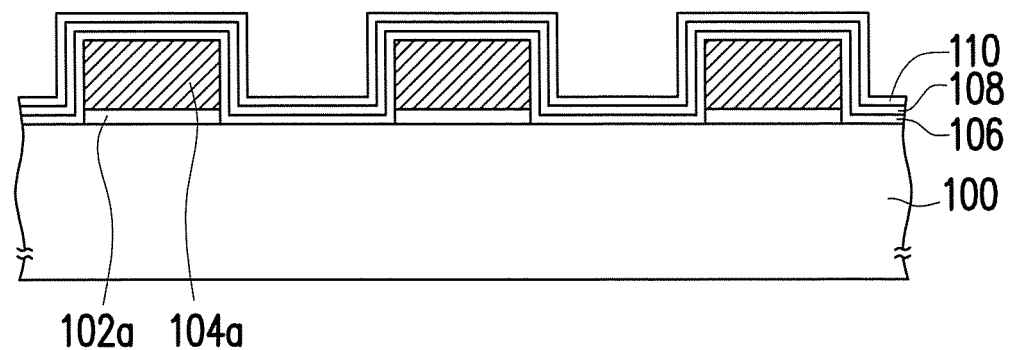

Referring to FIG. 1B, the conductive layer 104 and the dielectric layer 102 are patterned to form a floating gate 104a and a gate dielectric layer 102a. Thereafter, an oxide layer 106, a nitride layer 108 and an oxide layer 110 are conformally formed on the substrate 100. The method of forming the oxide layer 106 includes performing a CVD process. The thickness of the oxide layer 106 can be between 15 angstroms and 60 angstroms, preferably between 30 angstroms and 50 angstroms, and more preferably 40 angstroms. The method of forming the nitride layer 108 includes performing a CVD process. The thickness of the nitride layer 108 can be between 15 angstroms and 100 angstroms, preferably between 30 angstroms and 50 angstroms, and more preferably 40 angstroms. The method of forming the oxide layer 110 includes performing a CVD process. The thickness of the oxide layer 110 can be between 15 angstroms and 60 angstroms, preferably between 30 angstroms and 50 angstroms, and more preferably 50 angstroms.

Figure 1C:
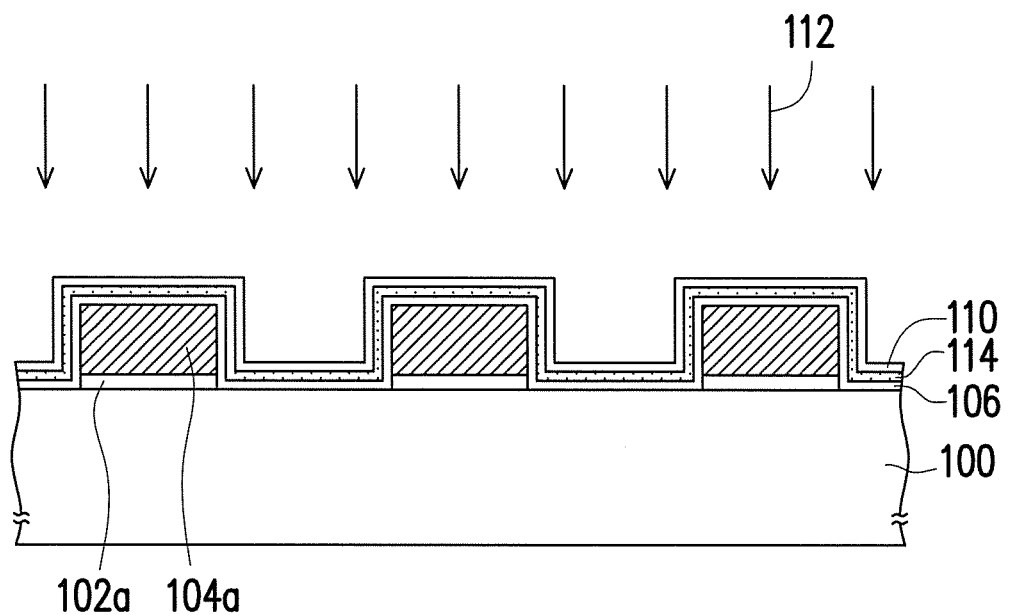

Referring to FIG. 1C, a charging treatment 112 is preformed to the nitride layer 108, so as to form a charged nitride layer 114. In the present embodiment, the charging treatment 112 can be, but is not limited to, performing an implantation to the nitride layer 108 with an N-type dopant. The N-type dopant includes phosphorous (P) or boron (B).

Figure 1D:
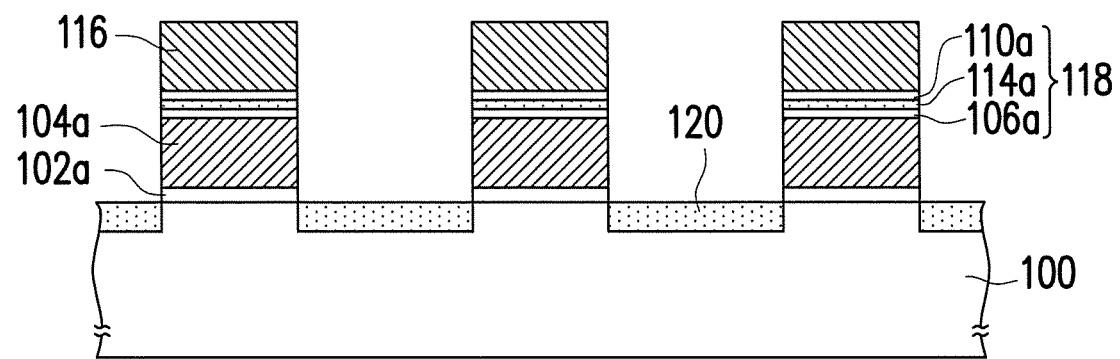

Referring to FIG. 1D, a conductive layer (not shown) is formed on the substrate 100 covering the oxide layer 110. The conductive layer includes polysilicon, and the forming method thereof includes performing a CVD process. Thereafter, a pattering step is preformed to remove a portion of the conductive layer, so as to form a control gate 116. Besides, a portion of the oxide layer 110, a portion of the charged nitride layer 114 and a portion of the oxide layer 110 are simultaneously removed during the patterning step, so as to form an oxide layer 110a, a charged nitride layer 114a and an oxide layer 106a. The oxide layer 110a, the charged nitride layer 114a and the oxide layer 106a form an inter-gate dielectric structure 118 between the floating gate 104a and the control gate 116. Afterwards, two doped regions 120 are formed in the substrate 100 respectively at two sides of the floating gate 104a. The non-volatile memory 10 of this embodiment is thus completed. The method of forming the doped regions 120 includes performing an ion implantation process.

In the non-volatile memory 10, the nitride layer in the inter-gate dielectric structure 118 is charged and therefore builds in an internal E-field. As a result, a trapping barrier for electrons becomes shallow, so that the electrons have a greater possibility of moving randomly and the conductivity of the nitride layer is accordingly increased. The nitride layer becomes more conductive and can be regarded as having a reduced electrical thickness, so that the nitride layer having a higher capacitance is obtained. Since the nitride layer in the inter-gate dielectric structure 118 has a higher capacitance, the gate coupling ratio and transconductance of the non-volatile memory 10 can be increased.

Figure 2:
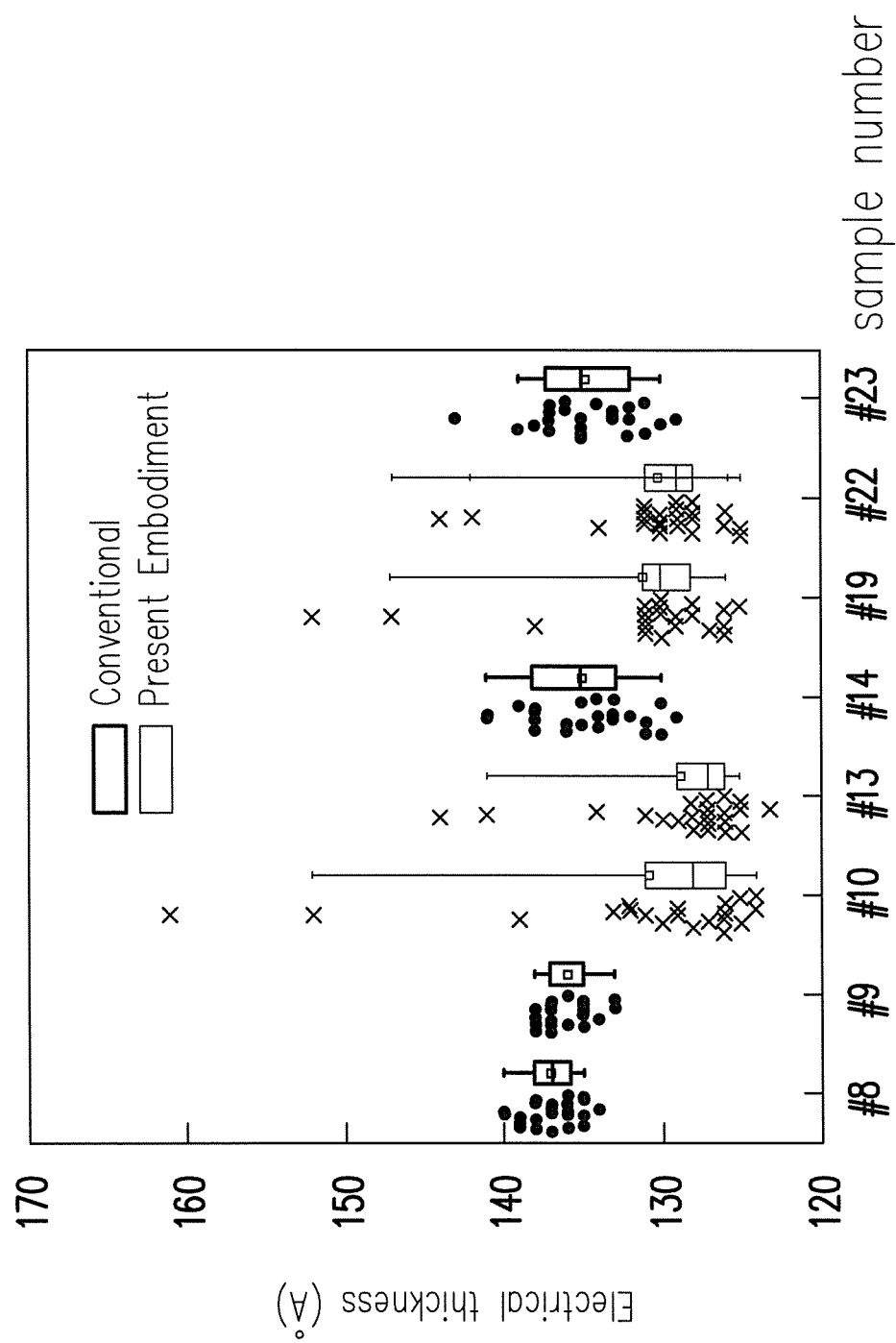
FIG. 2 is a comparison chart between the inter-gate dielectric structure with a charged nitride layer of the present embodiment and the conventional inter-gate dielectric structure with a non-charged nitride layer.

FIG. 2 is a comparison chart between the inter-gate dielectric structure with a charged nitride layer of the present embodiment and the conventional inter-gate dielectric structure with a non-charged nitride layer. The inter-gate dielectric structure of the present embodiment has the same actual thickness as the conventional inter-gate dielectric structure. However, as shown in FIG. 2, the inter-gate dielectric structure of the present embodiment exhibits a smaller electrical thickness, which results in, in the present embodiment, a higher capacitance of the inter-gate dielectric structure and therefore a higher gate coupling ratio of the non-volatile memory.

Figure 3:
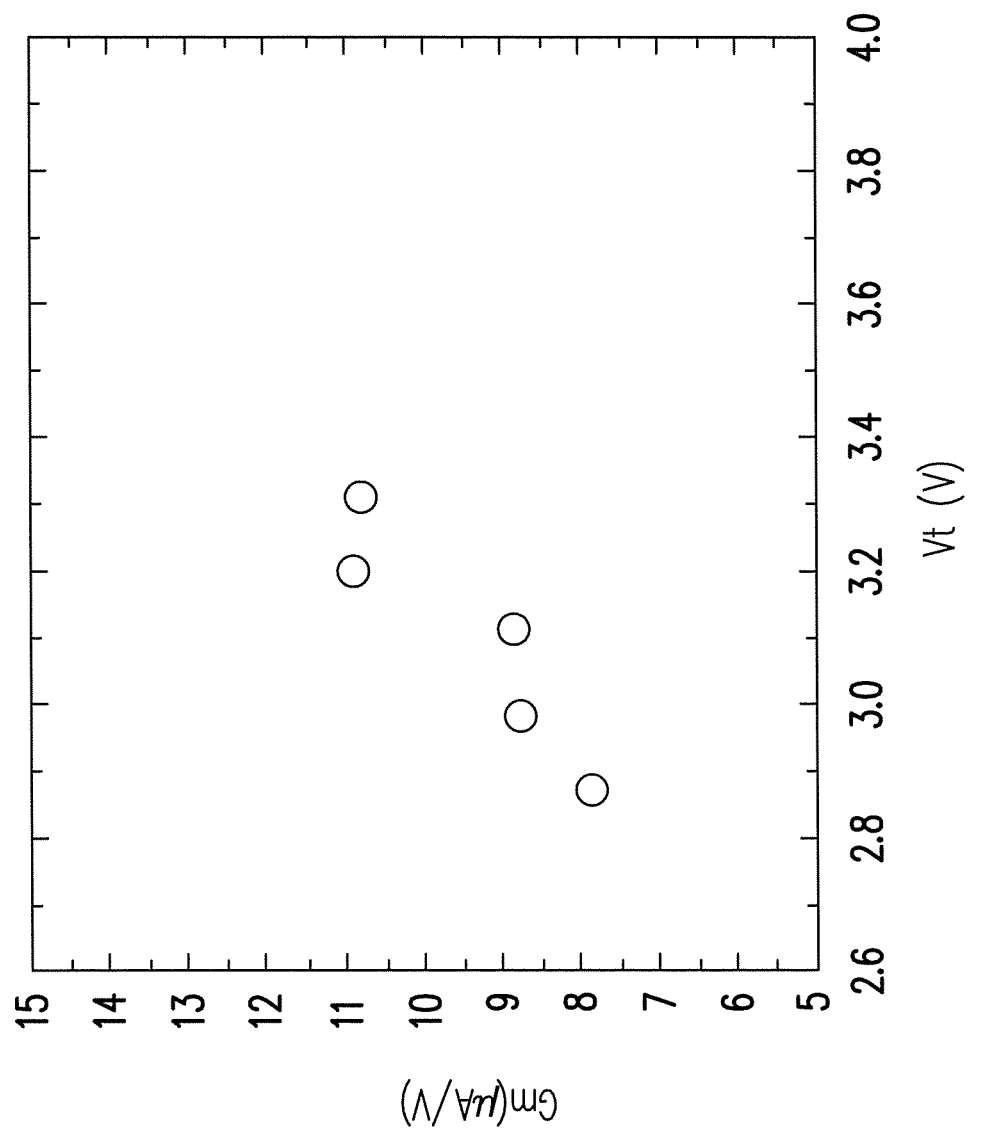
FIG. 3 is a correlation chart between the transconductance and the threshold voltage (Vt) of the non-volatile memory of the present embodiment.

FIG. 3 is a correlation chart between the transconductance and the threshold voltage (Vt) of the non-volatile memory of the present embodiment. As shown in FIG. 3, the threshold voltage is increased as the transconductance becomes greater. In other words, a higher transconductance of the non-volatile memory of the present embodiment can be easily obtained.

Figure 4:
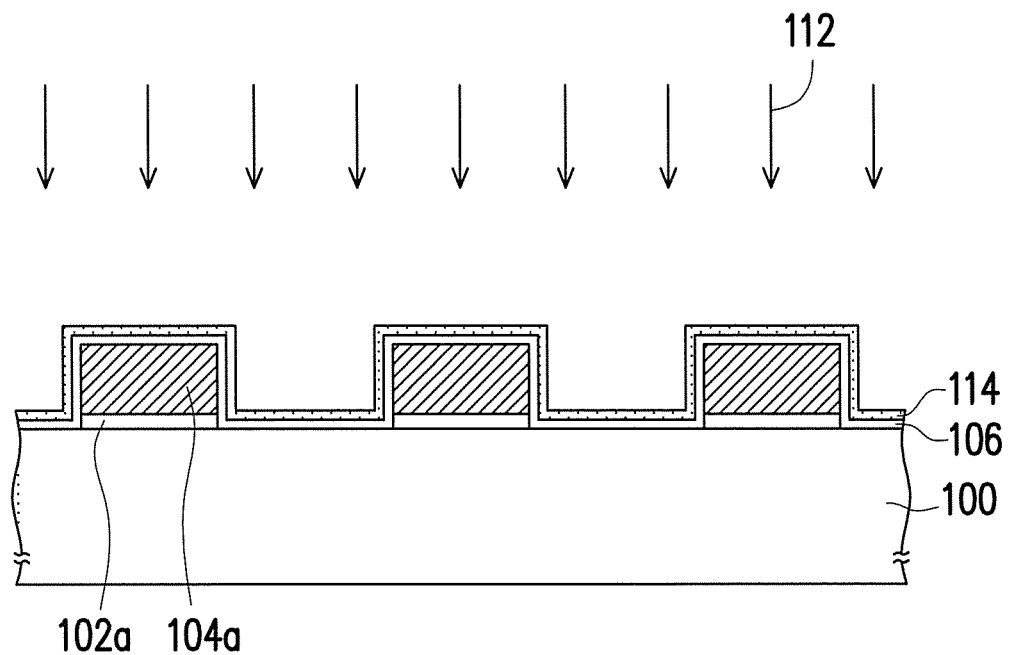
FIG. 4 to FIG. 6 are cross-sectional views of performing a charging treatment to each of the nitride layers in various embodiments of the present invention.
Figure 5:
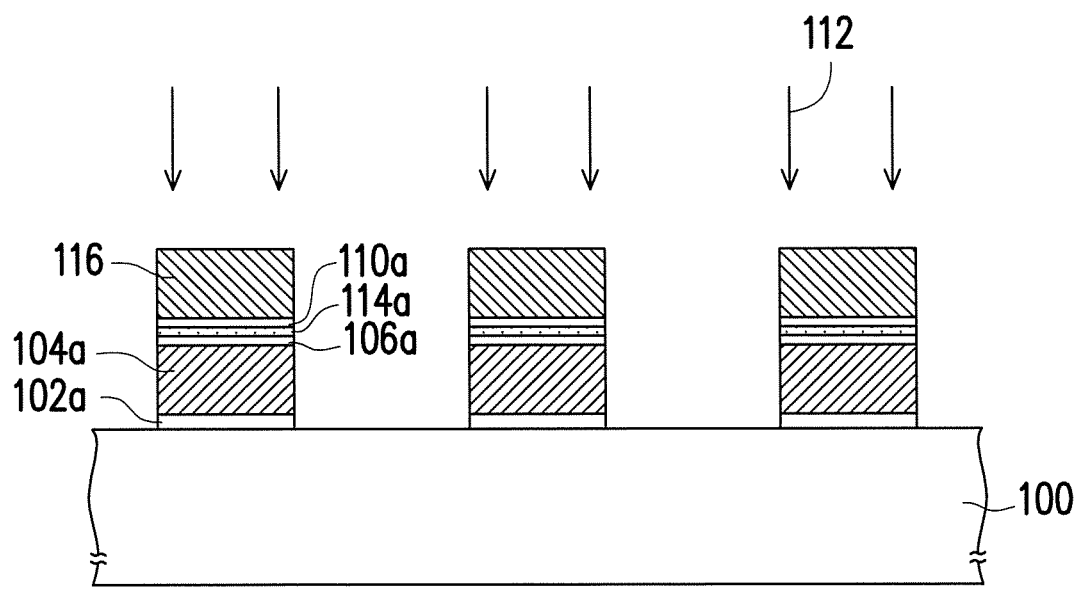
Figure 6:
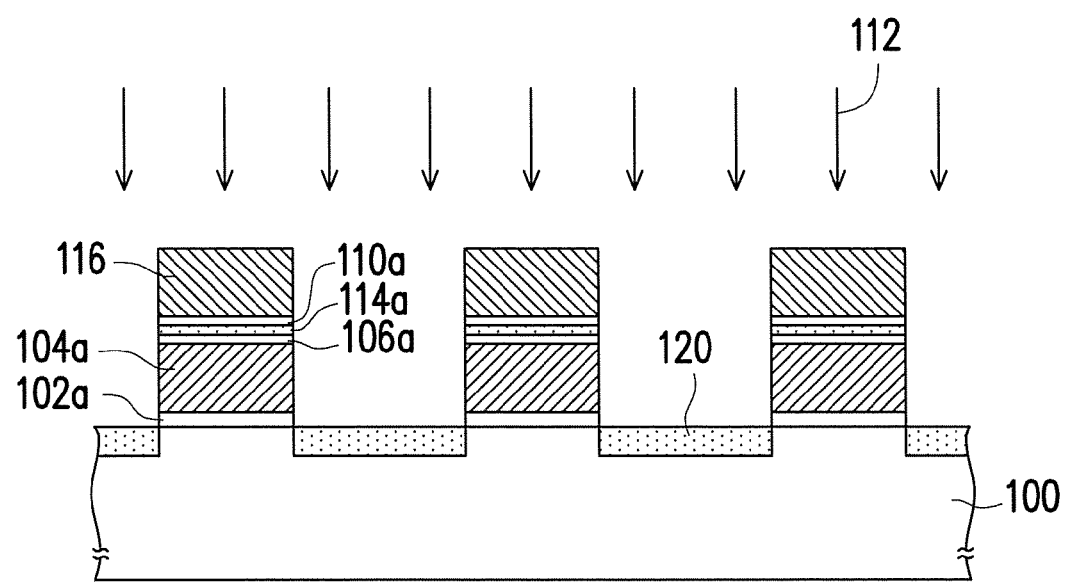

It is noted in the present embodiment, the charged nitride layer 114 is formed by performing a charging treatment 112 to the nitride layer 108 after the oxide layer 110 is formed. However, the present invention is not limited thereto. In other embodiments, the charging treatment 112 to the nitride layer 108 can be performed at any other time point after the nitride layer 108 is formed. For example, some suitable time points are described below. In an embodiment, the charging treatment 112 can be performed to the nitride layer 108 to form the charged nitride layer 114 immediately after the nitride layer 108 is formed, as shown in FIG. 4. In another embodiment, the charging treatment 112 can be performed to the patterned nitride layer 108 to form the charged nitride layer 114a immediately after the control gate 116 is formed, as shown in FIG. 5. In yet another embodiment, the charging treatment 112 can be performed to the patterned nitride layer 108 to form the charged nitride layer 114a during the step of forming the doped regions 120, as shown in FIG. 6.

Further, in the said embodiments, an N-type dopant implantation is performed to the nitride layer in the inter-gate dielectric structure to form a charged nitride layer. However, the present invention is not limited thereto. In another embodiment, a voltage can be applied to the control gate after the non-volatile memory is formed with the existing processes, and electrons are injected into the nitride layer in the inter-gate dielectric structure by using Fowler-Nordheim tunneling (FN tunneling), so as to form a charged nitride layer.

Figure 7A:
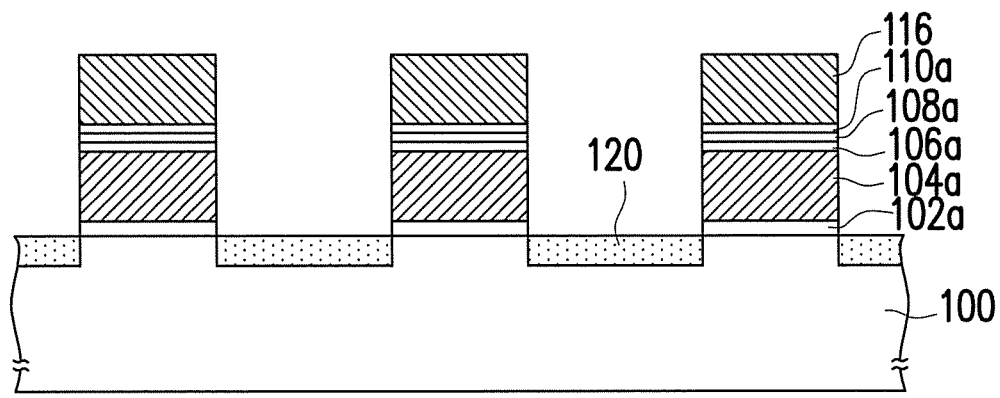
FIG. 7A to FIG. 7B are cross-sectional views illustrating a manufacturing method of a non-volatile memory according to another embodiment of the present invention.
Figure 7B:
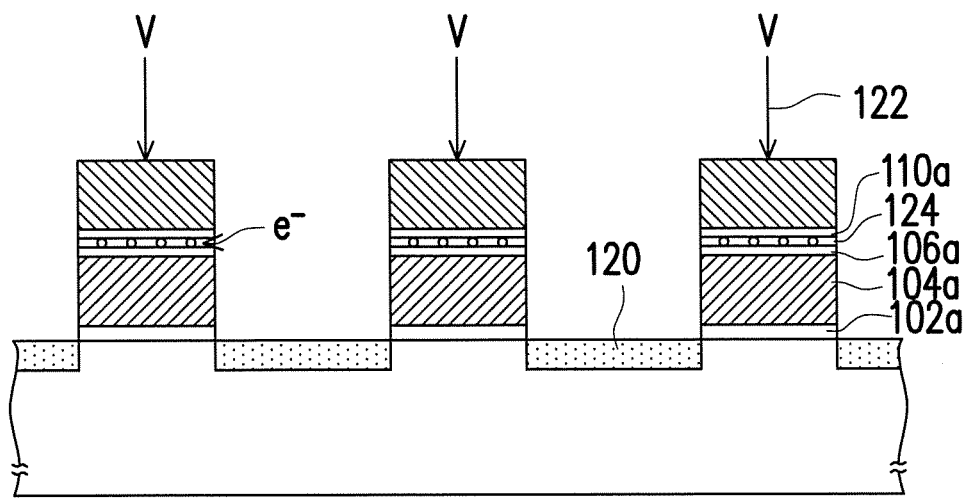

FIG. 7A to FIG. 7B are cross-sectional views illustrating a manufacturing method of a non-volatile memory according to another embodiment of the present invention. Referring to FIG. 7A, a non-volatile memory 70 is formed with the similar process steps as described in FIG. 1A to FIG. 1D, except that the N-type dopant implantation is omitted after forming the nitride layer 108, so that a non-charged nitride layer 108a is formed.

Referring to FIG. 7B, a charging treatment 122 is performed, in which a voltage V is applied to the control gate 116 to inject electrons into the nitride layer 108a by using FN tunneling, so as to form a charged nitride layer 124. The non-volatile memory 70a of the present embodiment is thus completed. In this embodiment, the voltage V can be, but is not limited to, more than 7 MV/cm.

Figure 8:
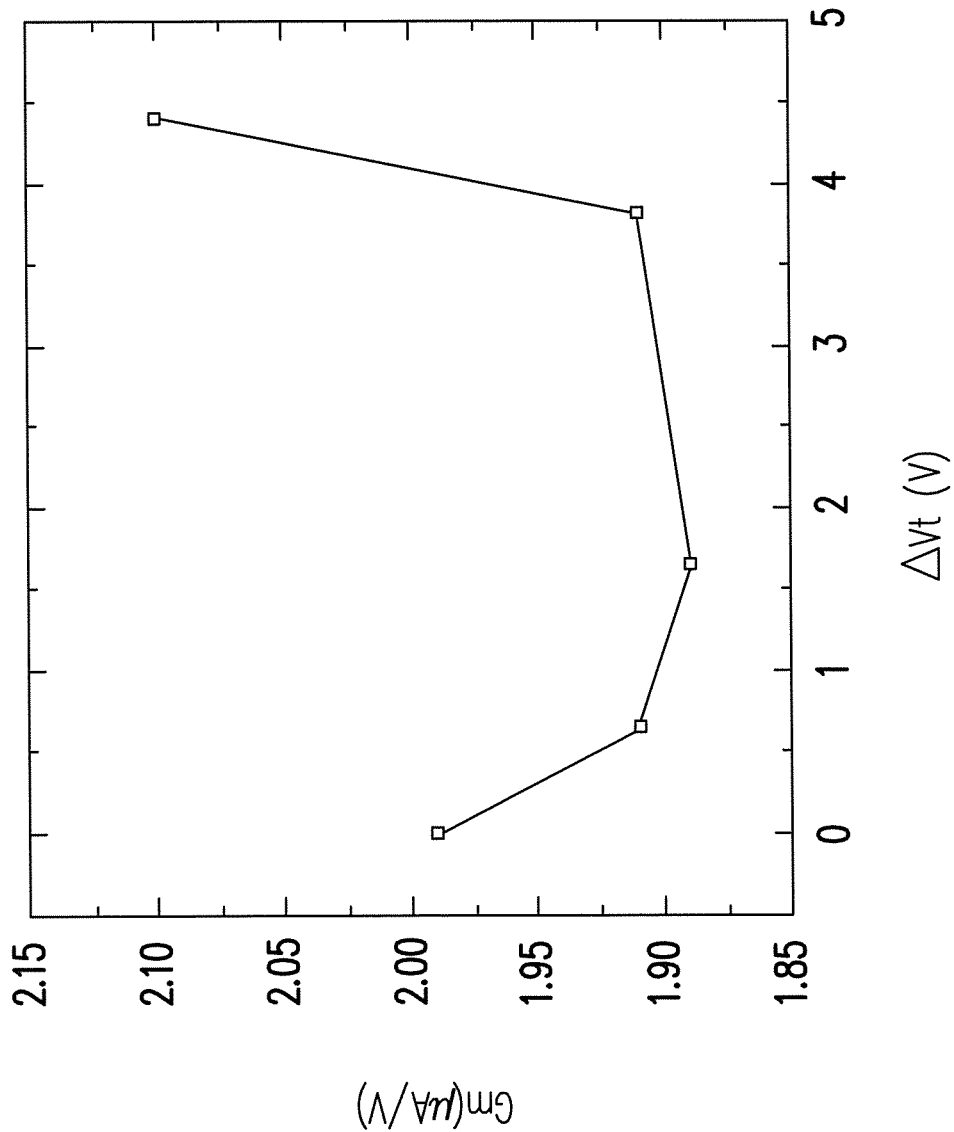
FIG. 8 is a chart for verifying that high memory performance is associated with the charged nitride layer by using an Nbit cell model.

FIG. 8 is a chart for verifying that high memory performance is associated with the charged nitride layer by using an Nbit cell. As shown in FIG. 8, after applying a voltage to injecting electrons by using FN tunneling, the transconductance gradually trends up as the variance of the threshold voltage ($\Delta Vt$) is increased.

In summary, in the present invention, after the nitride layer in the inter-gate dielectric structure is formed, a charging treatment is performed thereto as so to form a charged nitride layer. Therefore, the conductivity of the nitride layer is enhanced and the gate coupling ratio and transconductance of the non-volatile memory is accordingly increased. Since the inter-gate dielectric structure has a higher capacitance, the non-volatile memory of the present invention can exhibit higher gate coupling ratio and transconductance.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A manufacturing method of a non-volatile memory, comprising:
    forming a gate dielectric layer on a substrate;
    forming a floating gate on the gate dielectric layer;
    forming a first charge blocking layer on the floating gate;
    forming a nitride layer on the first charge blocking layer;
    forming a second charge blocking layer on the nitride layer;
    forming a control gate on the second charge blocking layer; and
    performing a treatment to the nitride layer to get a higher dielectric constant.

2. The manufacturing method of claim 1, wherein the charging treatment comprises performing an implantation to the nitride layer with an N-type dopant.

3. The manufacturing method of claim 2, wherein the treatment is performed after the step of forming the nitride layer and before the step of forming the second charge blocking layer.

4. The manufacturing method of claim 2, wherein the treatment is performed after the step of forming the second charge blocking layer and before the step of forming the control gate.

5. The manufacturing method of claim 2, wherein the treatment is performed after the step of forming the control gate.

6. The manufacturing method of claim 1, wherein the treatment comprises injecting charges into the nitride layer.

7. The manufacturing method of claim 6, wherein the treatment comprises applying a voltage of more than 7 MV/cm to the control gate, so as to inject the electrons into the nitride layer.

8. A manufacturing method of a non-volatile memory, comprising:
- forming a gate dielectric layer on a substrate;
- forming a floating gate on the gate dielectric layer;
- forming an inter-gate dielectric structure on the floating gate, wherein the inter-gate dielectric structure comprising a nitride layer;
- forming a control gate on the inter-gate dielectric structure;
- forming two doped regions in the substrate respectively at two sides of the floating gate; and
- performing a trapping treatment to the inter-gate dielectric structure.

9. The manufacturing method of claim 8, wherein the trapping treatment comprises performing an implantation to the nitride layer with an N-type dopant.

10. The manufacturing method of claim 9, wherein the inter-gate dielectric structure comprises a first charge blocking layer formed on the floating gate, the nitride layer formed on the first charge blocking layer and a second charge blocking layer formed on the nitride layer.

11. The manufacturing method of claim 10, wherein the trapping treatment is performed after the step of forming the nitride layer and before the step of forming the second charge blocking layer.

12. The manufacturing method of claim 10, wherein the trapping treatment is performed after the step of forming the second charge blocking layer and before the step of forming the control gate.

13. The manufacturing method of claim 9, wherein the trapping treatment is performed after the step of forming the control gate and before the step of forming the doped regions.

14. The manufacturing method of claim 9, wherein the trapping treatment is performed simultaneously during the step of forming the doped regions.

15. The manufacturing method of claim 8, wherein the trapping treatment comprises injecting charges into the inter-gate dielectric structure.

16. The manufacturing method of claim 15, wherein the trapping treatment is performed after the step of forming the doped regions, and the charging treatment comprises applying a voltage of more than 7 MV/cm to the control gate, so as to inject the electrons into the nitride layer.

17. The manufacturing method of claim 8, wherein the trapping treatment comprises injecting electrons into the inter-gate dielectric structure.

18. The manufacturing method of claim 8, wherein the inter-gate dielectric getting higher dielectric constant after the trapping treatment.

19. The manufacturing method of claim 8, wherein the inter-gate dielectric structure comprising a nitride material.

* * * * *